(12) United States Patent
Chen

(10) Patent No.: US 6,541,309 B2
(45) Date of Patent: Apr. 1, 2003

(54) FABRICATING A MOLECULAR ELECTRONIC DEVICE HAVING A PROTECTIVE BARRIER LAYER

(75) Inventor: Yong Chen, Redwood City, CA (US)

(73) Assignee: Hewlett-Packard Development Company LP, Houston, TX (US)

( * ) Notice: Subject to any disclaimer, the term of this patent is extended or adjusted under 35 U.S.C. 154(b) by 24 days.

(21) Appl. No.: 09/815,844

(22) Filed: Mar. 21, 2001

(65) Prior Publication Data

US 2002/0171148 A1 Nov. 21, 2002

(51) Int. Cl.[7] .............................................. H01L 21/44
(52) U.S. Cl. ....................... 438/118; 438/939; 438/951; 365/151
(58) Field of Search .................... 365/151; 438/951, 438/939, 1, 118

(56) References Cited

U.S. PATENT DOCUMENTS 6,128,214 A    10/2000  Kuekes et al.
6,198,655 B1 *  3/2001  Heath et al. ................. 365/151

* cited by examiner

Primary Examiner—Nathan J. Flynn
Assistant Examiner—Leonardo Andujar

(57) ABSTRACT

A process of fabricating a molecular electronic device that preserves the integrity of the active molecular layer of the electronic device during processing is described. In one aspect, a barrier layer is provided to protect a molecular layer sandwiched between a bottom wire layer and a top wire layer from degradation during patterning of the top wire layer. A molecular electronic device structure and a memory system that are formed from this fabrication process are described.

17 Claims, 4 Drawing Sheets

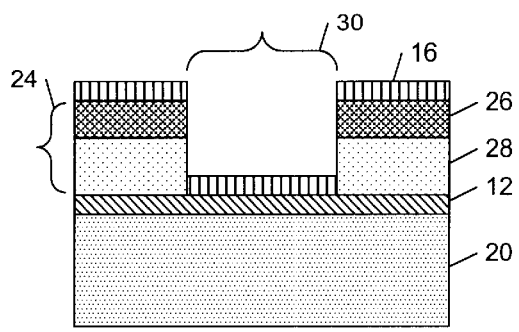
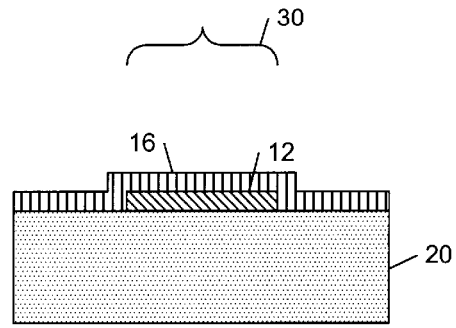
FIG. 5A  FIG. 5B
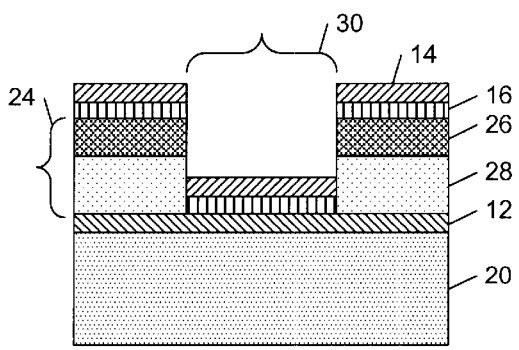
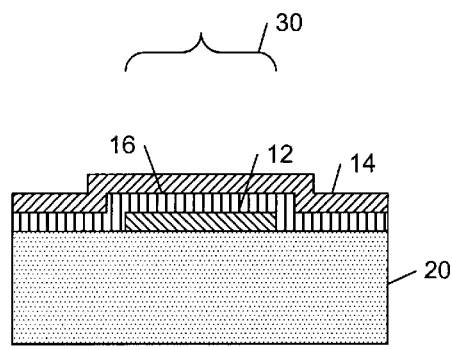
FIG. 6A  FIG. 6B
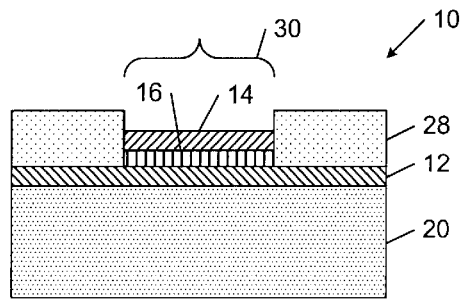
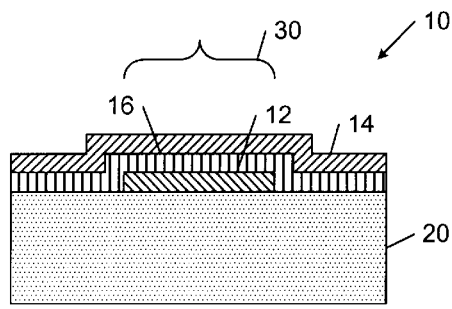
FIG. 7A  FIG. 7B

US 6,541,309 B2

FABRICATING A MOLECULAR ELECTRONIC DEVICE HAVING A PROTECTIVE BARRIER LAYER

CROSS-REFERENCE TO RELATED APPLICATIONS

This application is related to U.S. application Ser. No. 09/282,048 now U.S. Pat. No. 6,459,095 filed on Mar. 29, 1999, by James R. Heath et al., and entitled "Chemically Synthesized and Assembled Electronic Devices," which is incorporated herein by reference.

TECHNICAL FIELD

This invention relates to systems and methods for fabricating molecular electronic devices.

BACKGROUND

Many different molecular electronic logic and memory devices have been proposed.

For example, in one molecular electronic device structure, a molecular layer (e.g., a Langmuir-Blodgett film) is sandwiched between a pair of electrically conducting layers (e.g., a pair of metal layers, a metal layer and a doped semiconductor layer, or a pair of doped semiconductor layers). The molecular layer serves as a thin insulating film that may be used in a metal-insulator-metal (MIM) structure that may be configured as a tunnel junction device or a switching device, or a metal-insulator-semiconductor (MIS) structure that may be configured as an electroluminescent device.

U.S. Pat. No. 6,128,214 describes another molecular electronic device structure that is configured as a molecular wire crossbar memory (MWCM) system formed from a two-dimensional array of nanometer-scale devices. Each MWCM device is formed at the crossing point (or junction) of a pair of crossed wires where at least one molecular connector species operates as a bi-stable molecular switch between the pair of crossed wires. The resulting device structure may be configured as a resistor, a diode or an asymmetric non-linear resistor. The state of each MWCM device may be altered by applying a relatively high, but non-destructive, state-changing voltage and may be sensed with a non-state-changing voltage.

Still other molecular electronic devices have been proposed.

SUMMARY

The invention features a novel process of fabricating a molecular electronic device that preserves the integrity of the active molecular layer of the electronic device during processing. In addition, the invention features a novel molecular electronic device structure and a novel memory system that are formed with this fabrication process.

In one aspect, the invention features a method of fabricating a molecular electronic device in accordance with which a barrier layer is provided to protect a molecular layer, which is sandwiched between a bottom wire layer and a top wire layer, from degradation during patterning of the top wire layer.

Embodiments of the invention may include one or more of the following features.

The molecular layer and the top wire layer preferably have a combined thickness that is less than the barrier layer thickness in a region defining the molecular electronic device.

The top wire layer preferably is patterned by disposing a lift-off layer over the barrier layer, disposing an electrically conductive layer over the molecular layer and the lift-off layer, and dissolving the lift-off layer. The lift-off layer preferably has a different solubility characteristic than the barrier layer. The lift-off layer preferably is dissolved with a solvent with respect to which the barrier layer is substantially insoluble. In some embodiments, the lift-off layer may comprise a polymer (e.g., PMMA) and the barrier layer may comprise a different polymer (e.g., PDMS). In these embodiments, the lift-off layer may be dissolved in acetone. In other embodiments, the lift-off layer may comprise a polymer and the barrier layer may comprise an inorganic electrical insulator.

In another aspect of the invention, a molecular electronic device is fabricated as follows. A patterned bottom wire layer is disposed over a substrate. A composite layer, which includes a lift-off layer and an underlying barrier layer, is disposed over the patterned bottom wire layer. The composite layer is patterned to define a device region in which the bottom wire layer is exposed through the lift-off layer and the barrier layer. A molecular layer and an overlying top wire layer are disposed over the patterned composite layer and the exposed bottom wire layer. The molecular layer and the top wire layer have a combined thickness in the device region that is less than the thickness of the barrier layer defining the device region. The top wire layer is patterned by dissolving the lift-off layer with a solvent with respect to which the barrier layer is substantially insoluble.

The invention also features a molecular electronic device that includes a bottom wire layer, a molecular layer disposed over the bottom wire layer in a device region, a top wire layer disposed over the molecular layer in the device region, and a barrier layer. The barrier layer defines the device region and has a thickness that is greater than a combined thickness of the molecular layer and the top wire layer.

In another aspect, the invention features a molecular memory system comprising an array of devices corresponding to the molecular electronic device described in the preceding paragraph.

Other features and advantages of the invention will become apparent from the following description, including the drawings and the claims.

DESCRIPTION OF DRAWINGS

FIGS. 5A and 5B are orthogonal diagrammatic cross-sectional side views of a molecular layer disposed over the patterned composite layer of FIGS. 4A and 4B.

FIGS. 6A and 6B are orthogonal diagrammatic cross-sectional side views of an electrically conductive layer disposed over the molecular layer of FIGS. 5A and 5B.

FIGS. 7A and 7B are orthogonal diagrammatic cross-sectional side views of the electrically conductive layer of FIGS. 6A and 6B patterned to define a top wire layer of a molecular electronic-device.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
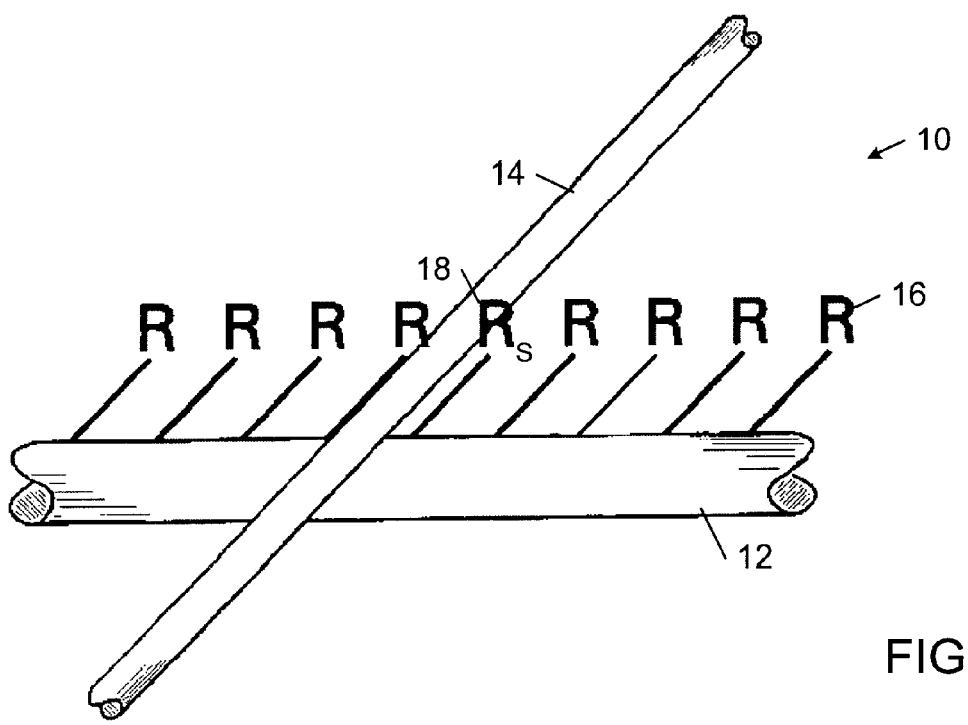
FIG. 1 is a diagrammatic perspective representation of a molecular electronic device formed from at least one electrically addressable molecular species that is sandwiched between two crossed electrically conductive wires.

Referring to FIG. 1, in one embodiment, a molecular electronic device 10 includes two electrically conducting wires 12, 14 that are crossed at a non-zero angle. Each wire 12, 14 may be formed from a metal or a doped semiconductor material. A layer of bi-stable molecules or molecular compounds 16 (denoted by the symbol R) is sandwiched between wires 12, 14. The particular molecule or molecules 18 (denoted by the symbol $R_s$) that are located at the intersection (or junction) of wires 12, 14 act as switch molecules and correspond to the active portion of molecular electronic device 10. In operation, the state of molecular electronic device 10 may be changed by applying a relatively high state-changing voltage across wires 12, 14. The magnitude of the state-changing voltage is sufficient to oxidize or reduce switch molecules 18. Switch molecules 18 may include a redox pair of molecular species that cooperate to balance charge such that when one of the molecular species is oxidized (or reduced), the other molecular species is reduced (or oxidized). In operation, in one example, one molecular species may be reduced and the associated molecular species (the other half of the redox pair) may be oxidized. In another example, one molecular species may be reduced and one of the wires 12, 14 may be oxidized. In a third example, one molecular species may be oxidized and one of the wires 12, 14 may be reduced. In a fourth example, one wire may be oxidized and an oxide associated with the other wire may be reduced. In each of these examples, oxidation or reduction affects the tunneling distance or the tunneling barrier height between the two wires, thereby exponentially altering the rate of charge transport across the wire junction. This electronic functionality serves as the basis for operating molecular electronic device 10 as an electrical switch.

Additional details regarding the general features of molecular electronic device 10 may be obtained from U.S. Pat. No. 6,128,214, which is incorporated herein by reference.

As mentioned above, molecular electronic device 10 may be fabricated in a way that preserves the integrity of the active molecular layer 18. Referring to FIGS. 2–8B, in one embodiment, molecular electronic device 10 may be fabricated as follows.

Figure 2:
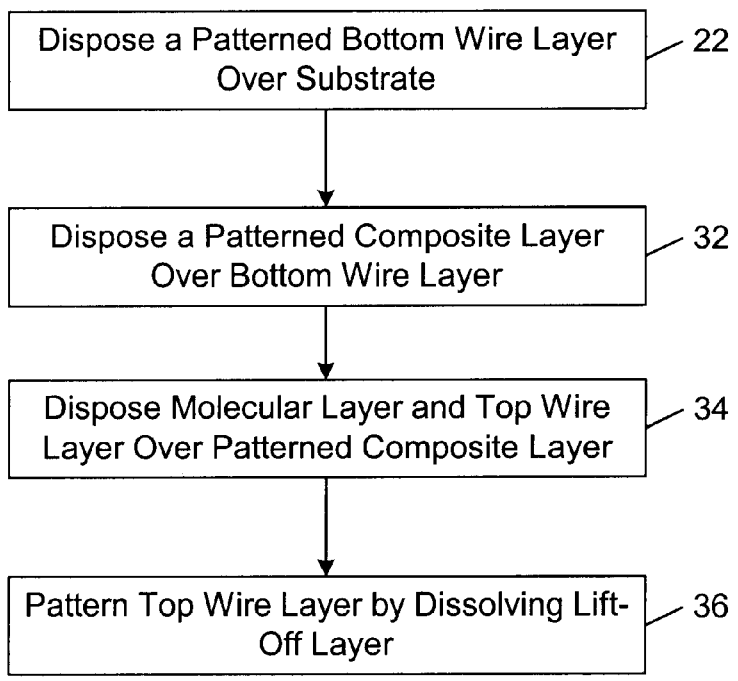
FIG. 2 is a flow diagram of a process of fabricating the molecular electronic device of FIG. 1.
Figure 3A:
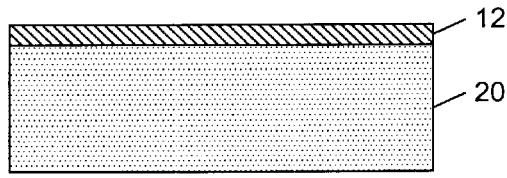
FIGS. 3A and 3B are orthogonal diagrammatic cross-sectional side views of a patterned bottom wire layer disposed over a substrate.
Figure 3B:
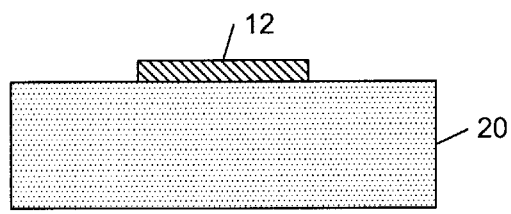

Referring initially to FIGS. 2, 3A and 3B, a patterned bottom wire layer 12 may be disposed over a substrate 20 (step 22). Bottom wire layer 12 may be formed from an electrically conducting metal or a doped semiconductor material, and may be deposited onto substrate 20 by a conventional thin film deposition process, including a physical film deposition process (e.g., magnetron sputtering or electron beam deposition) or a chemical film deposition process (e.g., chemical vapor deposition). Substrate 20 may be formed from an insulating material, for example, an oxide layer formed on a semiconductor substrate (e.g., a silicon dioxide ($SiO_2$) layer formed on a silicon substrate) or sapphire. After patterning (e.g., by lithography), bottom wire layer 12 may have a thickness dimension that ranges from 0.01–0.1 $\mu$m and a width dimension within a range that extends from on the order of 1 nm to several microns.

Figure 4A:
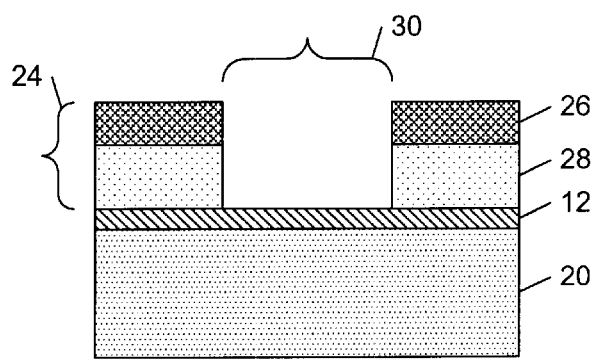
FIGS. 4A and 4B are orthogonal diagrammatic cross-sectional side views of a patterned composite layer disposed over the patterned bottom wire layer of FIGS. 3A and 3B.
Figure 4B:
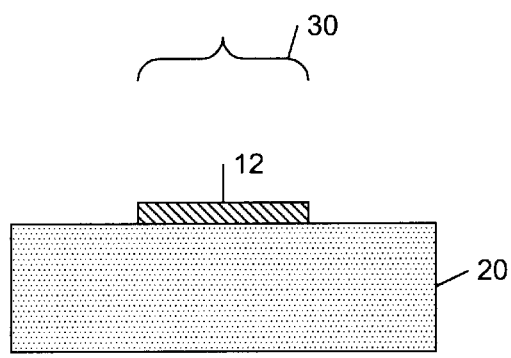

Referring to FIGS. 4A and 4B, a composite layer 24, which includes a lift-off layer 26 and an underlying barrier layer 28, is disposed over bottom wire layer 12 and patterned to define a device region 30 (step 32; FIG. 2). Lift-off layer 26 and barrier layer 28 are formed from different materials. In particular, lift-off layer 26 and barrier layer 28 are formed from materials with different solubility characteristics such that lift-off layer 26 may be dissolved in a solvent with respect to which barrier layer 28 is substantially insoluble. Lift-off layer 26 may be formed from a polymer (e.g., PMMA (poly-methyl methacrylate)) and barrier layer may be formed from a different polymer (e.g., PDMS (polydimethylsiloxane)) or an inorganic insulator (e.g., an oxide, such as $SiO_2$, $Si_3N_4$ or $AlO_x$). Polymer layers, such as PMMA and PDMS, may be deposited and patterned by conventional lithographic techniques (e.g., optical lithography, ultraviolet lithography, electron beam lithography or imprinting lithography). Inorganic insulator layers may be deposited and patterned by conventional lithographic techniques (e.g., optical lithography, ultraviolet lithography, electron beam lithography or imprinting lithography) or etch patterning techniques.

As shown in FIGS. 5A–6B, a molecular layer 16 and an electrically conducting top wire layer 14 are disposed over the patterned composite layer 24 (step 34; FIG. 2). In the device region 30, the thickness of barrier layer 28 is selected to be greater than the combined thickness of molecular layer 16 and top wire layer 14. As explained in detail below, the thickness and solubility characteristics of barrier layer 28 protect molecular layer 16 from degradation during the subsequent patterning of top wire layer 14.

Molecular layer 16 may be formed from a variety of different bi-stable molecular species (e.g., one or more of the rotaxane molecules described in U.S. application Ser. No. 09/282,048, filed on Mar. 29, 1999, which is incorporated herein by reference). In some embodiments, the selected molecular species may be dissolved in a solvent (e.g., tetrahydrofuran), prepared as a Langmuir monolayer, and transferred as a Langmuir-Blodgett single molecular monolayer film 16 over composite layer 24 and the portion of bottom wire layer 12 exposed through composite layer 24 in device region 30. Alternatively, the selected molecular thin film may be prepared by a self-assembled monolayer method or by a thermal deposition process. In other embodiments, a suitable molecular species may be deposited directly onto substrate 20.

Top wire layer 14 may be formed from an electrically conducting metal or a doped semiconductor material, and may be deposited onto molecular layer 16 by a conventional thin film deposition process, including a physical film deposition process (e.g., magnetron sputtering or electron beam deposition) or a chemical film deposition process (e.g., chemical vapor deposition).

Referring to FIGS. 7A and 7B, top wire layer 14 is patterned by dissolving the lift-off layer with a solvent with respect to which the barrier layer is substantially insolvent (step 36; FIG. 2). Because barrier layer 28 is thicker than the combined thickness of molecular layer 16 and top wire layer 14, barrier layer 28 seals and protects molecular layer 16 in device region 30 against intrusion of the lift-off solvent, an intrusion which otherwise would degrade or completely destroy molecular layer 16. The resulting molecular electronic device 10 is characterized by a barrier layer 28 that defines the device region 30 and has a thickness that is greater than the combined thickness of molecular layer 16 and top wire layer 14. Molecular electronic device 10 may have a thickness dimension that ranges from 0.01–0.1 µm and lateral dimensions that range from on the order of 10 nm to several microns.

EXAMPLE 1

In one embodiment, bottom wire layer 12 is formed from an aluminum layer (~0.01–0.1 µm thick) with a top $AlO_x$ coating (~1–2 nm thick) using conventional deposition and lithographic patterning techniques. Top wire layer 14 is formed from a titanium layer (~1–5 nm thick) and a top aluminum layer (~0.01–0.1 µm thick) that are deposited by electron beam deposition techniques. Bottom wire layer 12 and top wire layer 14 may have width dimensions ranging from about 10 nm to several microns.

Molecular layer 16 may be formed from one of the rotaxane molecules described in U.S. application Ser. No. 09/282,048, filed on Mar. 29, 1999. The selected rotaxane molecule is dissolved in a solvent (e.g., tetrahydrofuran), prepared as a Langmuir monolayer with a surface pressure of 28 milli-Newtons/meter, and transferred as a Langmuir-Blodgett single molecular monolayer film 16 over composite layer 24 and the portion of bottom wire layer 12 exposed through composite layer 24 in device region 30. The resulting molecular layer may have a surface coverage of 0.1–100 nm²/molecule with a thickness of about 5 Å A to about 100 Å.

Barrier layer 28 is formed from a PDMS layer (~0.01–1 µm thick) and lift-off layer 26 is formed from an PMMA layer (~0.01–1 µm thick). Barrier layer 28 and lift-off layer 26 may be patterned by a conventional optical lithography process or a conventional imprinting lithography process. Lift-off layer 26 is selectively removed during lift-off patterning of top wire layer 14 (step 36; FIG. 2) by dissolving lift-off layer 26 with acetone.

EXAMPLE 2

In another embodiment, bottom wire layer 12 is formed from an aluminum layer (~0.01–0.1 µm thick) with a top $AlO_x$ coating (~1–2 nm thick) using conventional deposition and lithographic patterning techniques. Top wire layer 14 is formed from a titanium layer (~1–5 nm thick) and a top aluminum layer (~0.01–0.1 µm thick) that are deposited by electron beam deposition techniques. Bottom wire layer 12 and top wire layer 14 may have width dimensions ranging from about 10 nm to several microns.

Molecular. layer 16 may be formed from one of the rotaxane molecules described in U.S. application Ser. No. 09/282,048, filed on Mar. 29, 1999. The selected rotaxane molecule is dissolved in a solvent (e.g., tetrahydrofuran), prepared as a Langmuir monolayer with a surface pressure of 28 milli-Newtons/meter, and transferred as a Langmuir-Blodgett single molecular monolayer film 16 over opposite layer 24 and the portion of bottom wire layer 12 exposed through composite layer 24 in device region 30. The resulting molecular layer may have a surface coverage of 0.1–100 nm²/molecule with a thickness of about 5 Å to about 50 Å.

Barrier layer 28 is formed from a silicon dioxide layer (~0.1–1 µm thick) and lift-off layer 26 is formed from a PMMA layer (~0.01–1 µm thick). Barrier layer 28 and lift-off layer 26 may be patterned by conventional lithographic and etching techniques, respectively. Lift-off layer 26 is selectively removed during lift-off patterning of top wire layer 14 (step 36; FIG. 2) by dissolving lift-off layer 26 with acetone.

Depending upon the molecules or materials selected for molecular layer 16, molecular electronic device 10 may exhibit any one of a variety of different electrical switching functions that may be used to controllably connect or disconnect bottom wire layer 12 and top wire layer 14. The molecular electronic device may be singly configurable or reconfigurable. In singly configurable embodiments, the initial state of molecular electronic device 10 may be open or closed. By electrically biasing molecular electronic device 10 beyond a particular threshold voltage, the active material or molecules 18 may be oxidized or reduced to permanently reverse the initial state of the device and, thereby, irreversibly close or open the switching state of the device. In reconfigurable embodiments, the switching device may be opened and closed multiple times by cycling the polarity and the magnitude of the applied voltage beyond appropriate threshold values that are selected to reversibly oxidize and reduce the active material or molecules 18.

In general, the type of electrical connection formed between bottom wire layer 12 and top wire layer 14 depends upon the materials from which wire layers 12, 14 and molecular layer 16 are formed. Table 1 identifies the various types of electrical switching functions that may be obtained from different device material combinations.

TABLE 1

| | Wire Layer Materials | | | | |
|---|---|---|---|---|---|
| Device Type | Metal-Metal (same) | Metal-Metal (different) | Metal-Semi-conductor | Semi-conductor-Semi-conductor (pn junction) | Semiconductor-Semiconductor (heterojunction) |
| Resistor | X | X | X | | |
| Tunneling Resistor | X | X | X | | |
| Resonant Tunneling Resistor | X | X | X | | |
| Diode | | X | X | X | X |
| Tunneling Diode | | X | X | X | |
| Resonant Tunneling Diode | | X | X | X | X |
| Battery | | X | X | | X |

Figure 8:
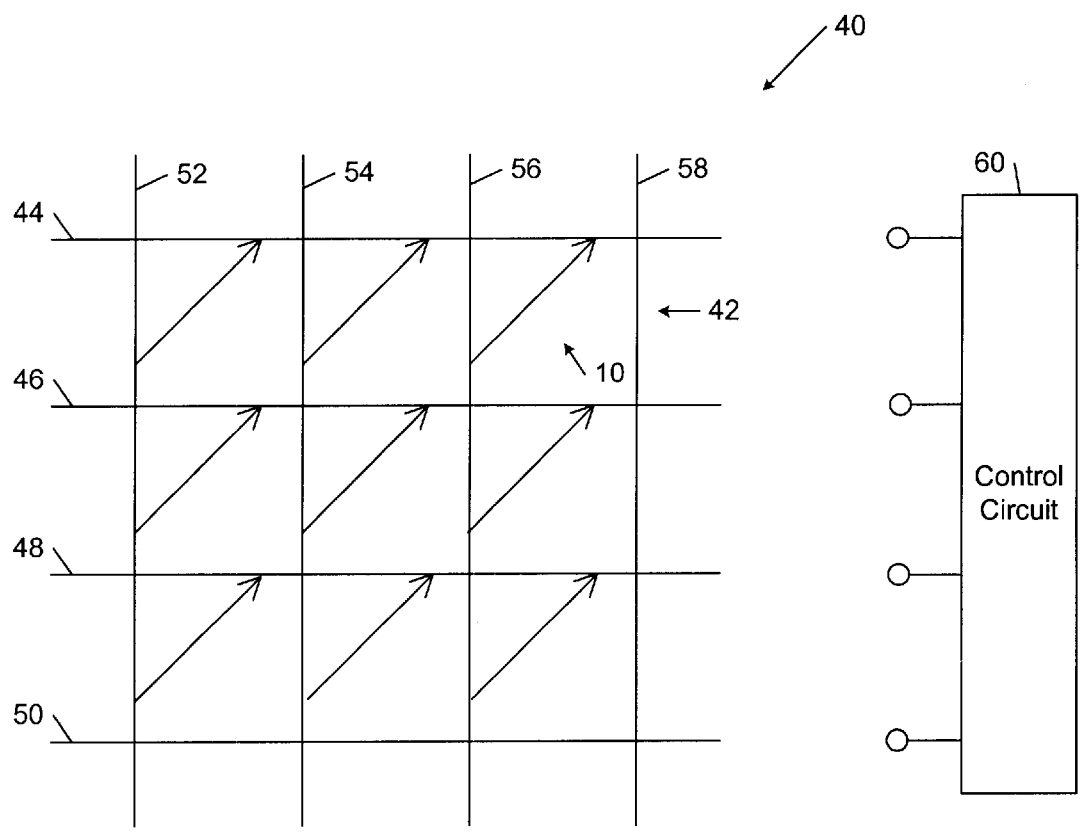
FIG. 8 is a circuit diagram of a resistive crossbar memory structure that includes an array of devices corresponding to the molecular electronic device of FIGS. 7A and 7B.

Referring to FIG. 8, in one embodiment, molecular electronic device 10 may be implemented in a resistive molecular wire crossbar memory 40 that includes a plurality of memory cells 42 that are arranged in multiple rows and multiple columns. Each memory cell 42 includes a molecular electronic device 10 that is coupled between a respective bottom wire line 44, 46, 48, 50 and a respective top wire line 52, 54, 56, 58. The voltage across a memory cell is determined by the voltages applied to the bottom wire line and the top wire line between which the memory cell is coupled. A control circuit 60 is configured to address (or select), program information into, and read information from one or more memory cells 42 within memory cell array 40. Molecular electronic devices 10 are activated by electro-chemical reduction or oxidation of the molecules 18 that are sandwiched between the bottom and top wire lines. In this embodiment, the molecules of molecular layer 16 are selected to have a large hysteresis in the voltammogram so that a switch may be oxidized at a relatively high voltage and its status may be read at a lower voltage. When a switch is (electrochemically) closed, the resistance between connecting wires is low, which may correspond to a logic level of "1".

When the switch is opened, the resistance is high, which may correspond to a logic level of "0". Further details regarding the operation of a resistive molecular crossbar memory may be obtained from U.S. Pat. No. 6,128,214.

Other embodiments are within the scope of the claims. For example, in addition to a resistive molecular wire crossbar memory, other molecular wire crossbar memory embodiments may include an array of molecular electronic devices that are configured to provide any one of the other switching functions identified in Table 1. In addition, the above-described molecular electronic devices may be implemented in a circuit designed to perform one or more logic (as opposed to memory) functions.

Still other embodiments are within the scope of the claims.

What is claimed is:

1. A method of fabricating a molecular electronic device, comprising:

providing a barrier layer to protect a molecular layer sandwiched between a bottom wire layer and a top wire layer from degradation during patterning of the top wire layer, wherein the molecular layer and the top wire layer have a combined thickness that is less than the barrier layer in a region defining the molecular electronic device.

2. The method of claim 1, wherein the top wire layer is patterned by disposing a lift-off layer over the barrier layer, disposing an electrically conductive layer over the molecular layer and the lift-off layer, and dissolving the lift-off layer.

3. The method of claim 2, wherein the lift-off layer has a different solubility characteristic than the barrier layer.

4. The method of claim 3, wherein the lift-off layer is dissolved with a solvent with respect to which the barrier layer is substantially insoluble.

5. The method of claim 2, wherein the lift-off layer comprises a polymer and the barrier layer comprises a different polymer.

6. The method of claim 5, wherein the lift-off layer comprises PMMA and the barrier layer comprises PDMS.

7. The method of claim 6, wherein the lift-off layer is dissolved with acetone.

8. The method of claim 2, wherein the lift-off layer comprises a polymer and the barrier layer comprises an inorganic electrical insulator.

9. The method of claim 1, wherein the barrier layer comprises an electrical insulator.

10. The method of claim 9, wherein the barrier layer comprises a polymer.

11. The method of claim 10, wherein the barrier layer comprises PDMS.

12. The method of claim 9, wherein the barrier layer comprises an inorganic electrical insulator.

13. A method of fabricating a molecular electronic device, comprising:

disposing a patterned bottom wire layer over a substrate;

disposing over the patterned bottom wire layer a composite layer including a lift-off layer and an underlying barrier layer, the composite layer being patterned to define a device region in which the bottom wire layer is exposed through the lift-off layer and the barrier layer;

disposing over the patterned composite layer and the exposed bottom wire layer a molecular layer and an overlying top wire layer with a combined thickness in the device region less than the barrier layer defining the device region; and patterning the top wire layer by dissolving the lift-off layer with a solvent with respect to which the barrier layer is substantially insoluble.

14. The method of claim 13, wherein the lift-off layer comprises a polymer and the barrier layer comprises a different polymer.

15. The method of claim 14, wherein the lift-off layer comprises PMMA and the barrier layer comprises PDMS.

16. The method of claim 13, wherein the lift-off layer comprises a polymer and the barrier layer comprises an inorganic electrical insulator.

17. The method of claim 13, wherein the lift-off layer is dissolved with acetone.

* * * * *